US011095981B2

(12) United States Patent
Graham et al.

(10) Patent No.: US 11,095,981 B2
(45) Date of Patent: Aug. 17, 2021

(54) ROOT MEAN SQUARE ADAPTIVE FILTERING FOR AMBIENT NOISE COMPENSATION SYSTEMS

(71) Applicant: MITEK CORP., INC., Phoenix, AZ (US)

(72) Inventors: Brandon Graham, Sandy, UT (US); Johnathan Ivey, Chandler, AZ (US)

( * ) Notice: Subject to any disclaimer, the term of this patent is extended or adjusted under 35 U.S.C. 154(b) by 0 days.

(21) Appl. No.: 16/852,041

(22) Filed: Apr. 17, 2020

(65) Prior Publication Data

US 2020/0389729 A1 Dec. 10, 2020

Related U.S. Application Data

(60) Provisional application No. 62/858,297, filed on Jun. 6, 2019.

(51) Int. Cl.
*H04R 3/04* (2006.01)
*G10L 21/0216* (2013.01)
*G06F 17/17* (2006.01)

(52) U.S. Cl.
CPC ............... *H04R 3/04* (2013.01); *G06F 17/17* (2013.01); *G10L 21/0216* (2013.01); *G10L 2021/02163* (2013.01); *H04R 2400/01* (2013.01)

(58) Field of Classification Search
CPC ... H04R 3/04; H04R 2400/01; G10L 21/0224; G10L 21/0216; G10L 21/0316; G10L 2021/02163; G10L 2021/02165; G06F 17/17; H03G 3/32
See application file for complete search history.

(56) References Cited

U.S. PATENT DOCUMENTS

| 5,027,410 | A | * | 6/1991 | Williamson | ......... | H04R 25/453 |
| | | | | | | 381/314 |
| 5,434,922 | A | | 7/1995 | Miller et al. | | |
| 5,450,494 | A | | 9/1995 | Okubo et al. | | |
| 5,666,426 | A | | 9/1997 | Helms | | |
| 6,868,162 | B1 | * | 3/2005 | Jubien | ....................... | H03G 5/22 |
| | | | | | | 381/107 |
| 2003/0156663 | A1 | * | 8/2003 | Burkert | .................. | H04N 19/89 |
| | | | | | | 375/341 |
| 2005/0089177 | A1 | | 4/2005 | Hughes et al. | | |
| 2009/0122997 | A1 | * | 5/2009 | Okumura | .................. | H03G 3/32 |
| | | | | | | 381/58 |
| 2012/0177221 | A1 | * | 7/2012 | Christoph | ................ | H03G 3/32 |
| | | | | | | 381/94.1 |

FOREIGN PATENT DOCUMENTS

| DE | 1720249 B1 | 6/2006 |
| JP | 2058945 B1 | 5/2009 |

* cited by examiner

*Primary Examiner* — Yogeshkumar Patel
(74) *Attorney, Agent, or Firm* — Keith L. Jenkins, Registered Patent Attorney, LLC; Keith L. Jenkins

(57) ABSTRACT

An apparatus instantiating a method for computing automatic noise compensation gain with an adaptive filter that receives ambient sound and source audio, down samples ambient sound and source audio, and filters the down sampled ambient sound and source audio to compute an RMS noise estimate from which a gain is determined. The present invention features highly efficient computations, as sampling rates are significantly lower. The present invention keeps audio data secure by transmitting only the mean-square audio levels instead of the audio itself.

20 Claims, 2 Drawing Sheets

ROOT MEAN SQUARE ADAPTIVE FILTERING FOR AMBIENT NOISE COMPENSATION SYSTEMS

RELATIONSHIP TO OTHER APPLICATIONS

This application claims the benefit of U.S. provisional patent application No. 62/858,297 filed Jun. 6, 2019 for the same inventor.

FIELD OF ART

The present invention relates to ambient noise compensation (ANC) systems. The present invention more particularly relates to using an adaptive filter to compute gain based on noise root mean squared (RMS) estimates derived from down sampled and filtered features of source audio and ambient noise signals. The present invention produces an estimate of the ambient noise RMS level which is used as a basis for determining the noise compensation gain changes.

BACKGROUND

Ambient Noise Compensation (ANC) systems have been around for decades. They actively modify the gains of an audio channel to accommodate changing ambient noise levels so the audio can be understood by the listener in a given audio environment.

Every ANC system needs to compute an estimate of the ambient noise levels of the environment in question. A complication arises with the fact that a noise-sensing microphone placed in the environment will pick up a combination of the ambient noise and the audio being broadcast into the environment from the sound system.

Various methods have been proposed for estimating the ambient noise levels from the microphone audio signal, but the most robust solutions involve the use of an adaptive filter which takes as inputs the audio signal to be broadcast and the microphone audio signal, and outputs the estimate of the ambient noise signal.

Solutions which do not employ an adaptive filter are much more prone to falsely attributing parts of the audio broadcast signal as part of the ambient noise signal. This can lead to a feedback loop where the ANC system falsely detects high levels of noise, which causes it to raise the audio signal gains, which results in even higher levels of detected noise, etc.

Several ANC solutions involving adaptive filters have been proposed and are in use today. See U.S. Pat. Nos. 8,259,961B2, 6,868,162B1, EP1720249A1, WO2001080423A2, U.S. Pat. Nos. 5,434, 922A, 5,450, 494A, JPH01248799A. While these solutions can perform well, they are computationally intense since they operate on audio signals at typical audio rates (8 kHz to 48 kHz). Down sampling the signals would reduce the computational load but this technique cannot be integrated into these solutions, because down sampling the audio by any significant factor would result in the loss of relevant information in the audio signals.

SUMMARY OF THE INVENTION

A new ANC system is proposed which is able to accurately estimate ambient noise levels in a environment by processing the down sampled mean square (MS) or root mean square (RMS^2) audio levels instead of the audio itself. The relevant information about ambient noise levels is still contained in the resulting noise RMS estimate which allows this process to be possible.

Mean squared (MS) levels are intentionally chosen because of an inherent property which makes the invention feasible. Assuming all audio signals are uncorrelated, the MS levels of those signals will sum linearly and should thus be usable by processes such as adaptive filters which assume such behavior. While the adaptive filter in the proposed invention uses MS levels, equivalent input signals may be achieved by accepting more common root-mean-squared (RMS) levels from an external source, then squaring those values to achieve MS levels acceptable for the adaptive filter.

The present invention features substantially reduced computational complexity, thereby reducing cost and energy consumption compared to its counterparts. Since audio mean square (MS) audio values change much more slowly than the actual audio values, the audio mean square values can be sampled and processed at a much lower rate, resulting in computations that are orders of magnitude more efficient than those of a traditional audio-rate adaptive filter.

The present invention keeps audio data more secure by transmitting only the mean-square audio levels instead of the audio itself. The audio signal isn't needed for the adaptive filter, and so the microphone is only required to send audio MS levels back to the main processing unit. This increases the privacy of the monitored party by guaranteeing the audio signal can't be monitored by any party with access to the main processing unit. The MS levels could still potentially be monitored, but they could only convey general activity levels: actual audio cannot be inferred from the MS audio level data.

DESCRIPTION OF THE FIGURES OF THE DRAWINGS

The present invention will hereinafter be described in conjunction with the following drawing figure, wherein like numerals denote like elements.

FIG. 1 is a diagrammatic view illustrating an exemplary first embodiment of an MS adaptive filter for ambient noise compensation system 100, according to a preferred embodiment of the present invention. Like the provisional embodiment, the first embodiment produces estimates derived from down sampled and filtered features of source audio 104 and ambient noise signals 102 to produce noise RMS estimates 126 for computing gain 132. FIG. 1 breaks down the system 100 into some of the critical components which will be addressed in turn. The system 100 has two inputs: microphone audio 102 that provides an audio signal representation of environmental sounds plus filtered source audio 104 in the audio environment for which the system is installed; and source audio 104 that provides an audio signal representation of the sounds to be broadcast from one or more loudspeakers in the audio environment for which the system 100 is installed.

Figure 1:
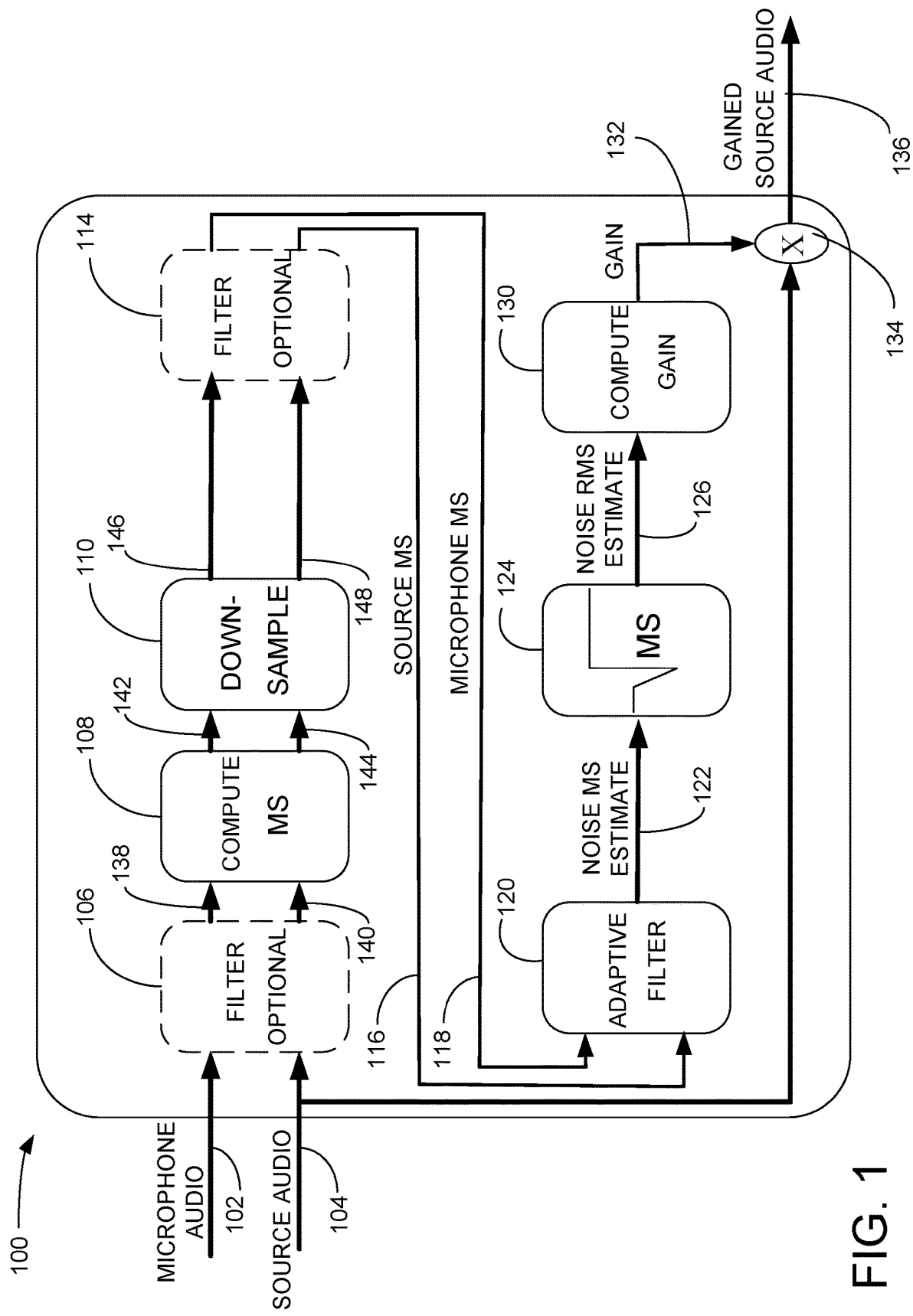
FIG. 1 is a diagrammatic view illustrating an exemplary first embodiment of an MS adaptive filter for ambient noise compensation system 100, according to a preferred embodiment of the present invention.

Optional filter 106 filters the incoming microphone audio 102 and the source audio 104 and is preferably a perceptual weighting filter, such as an A-Weighting filter, applied here to help the system 100 to respond to noise in a manner more consistent with human perception. In another embodiment, filter 106 may be omitted. In yet another embodiment, at least a portion of filter 106 may be integral with the microphone.

Computational section 108 computes the microphone MS signal 142 and the source MS signal 144 from the microphone audio signal 102 and the source audio signal 104 or, optionally, filtered microphone audio signal 138 and filtered source audio signal 140. In a preferred embodiment, the microphone portion of computational section 108 may be integral with the microphone. The input signals 138 and 140 to the computational section 108 are sampled at the high audio rate denoted frequency sampling audio (FS_AUDIO). In some preferred embodiments, FS_AUDIO is set to 48 kHz. Other embodiments may use other FS_AUDIO frequencies. The MS computation is done by squaring the input signals 138 and 140, and then filtering each with an infinite impulse response (IIR) lowpass filter. In some preferred embodiments, the time constant for the MS computation is sixty milliseconds, but this is not a limitation of the present invention. In various other embodiments, other time constants may be used.

The audio-rate microphone MS signal 142 and the audio-rate source MS signal 144 are each then subjected to a down-sampling process in down-sampler 110 where the number of MS samples per second are reduced from FS_AUDIO to a much slower MS sampling frequency (FS_MS). An FS_MS of 20 Hz was found to work well in a preferred embodiment, but other rates may be chosen in various other embodiments. Ideally, down-sampler 110 would process the MS data 142 and 144 with an anti-aliasing filter. A more complex anti-aliasing filter offers little benefit over a simple summing averaging filter, which is preferred. In various other embodiments, a better anti-aliasing filter, or no filter at all, may be used.

Optional filter 114 post filters the down-sampled MS microphone data 148 and the down-sampled MS source data 146 to produce adaptive filter 120 inputs of source MS data 116 and microphone MS data 118. Filter 114 isn't necessary, but may help improve performance of the adaptive filter 120. In one embodiment, it was found that high-pass filtering the MS data 116 and 118 helped improve the accuracy of the result.

Adaptive filter 120 takes the source and microphone MS level estimates 116 and 118 as inputs and delivers a noise MS level estimate 122 as its output. Note that the Noise MS level estimate 122 is the natural output of such an adaptive filtration process. Note that in actuality two independent signals will be momentarily correlated to varying degrees which will introduce errors in the Noise MS level estimate 122, but when the relationship is viewed over a long period of time, the two signals appear uncorrelated and the linear MS estimate relationships hold as expected.

This implies that there will be short-term errors in the results due to the short-term correlations of the source audio 104 and ambient noise. Thus, there is a need for some smoothing and long-term analysis of the result to get accurate estimates. The aggressiveness of the adaptive filter 120 can be modified in typical ways in order to accomplish the required level of smoothing. For example, in a typical closed-loop adaptive filter 120, the adaptation coefficient alpha can be modified such that the filter 120 does not over-react to momentary errors induced by short-term correlations of the source 104 and ambient noise signals.

Section 124 takes the square root of the noise MS estimate 122 to deliver the Noise RMS signal estimate 126.

Gain computer 130 uses known ANC algorithm logic which tracks the Noise RMS level estimates 126 and computes a gain target 132 based on those levels. The specifics are not relevant to this patent, other than that the gain computation is assumed to use ambient noise RMS level as a factor in the gain computation. The gain target 132 is applied to the source audio 104 in digital gain circuit 134 to produce gained source audio 136 to drive the loudspeakers.

While the microphone would typically transmit the MS data 142 to a main processing unit, in some embodiments Audio Source MS data 144 is transmitted to the microphone's processing unit and an estimate of the noise levels 126 is derived on that processor (sending back noise levels 126 or target gains 132 to the main processor).

Figure 2:
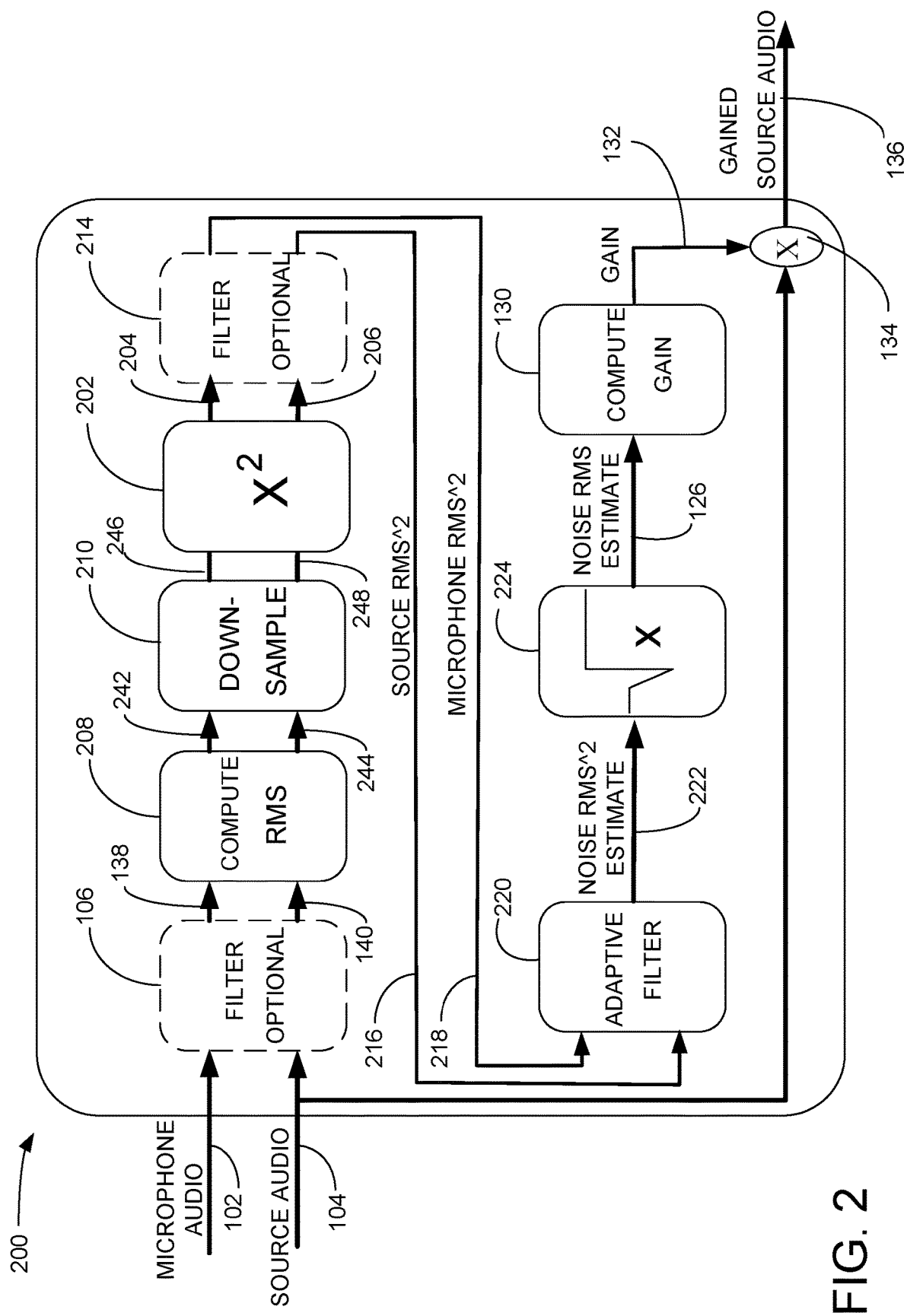
FIG. 2 is a diagrammatic view illustrating an exemplary second embodiment of an RMS^2 adaptive filter for ambient noise compensation system 200, according to another preferred embodiment of the present invention.

FIG. 2 is a diagrammatic view illustrating an exemplary embodiment of an RMS adaptive filter for ambient noise compensation system 200, according to another preferred embodiment of the present invention. Like the provisional embodiment, the second embodiment produces estimates derived from down sampled and filtered features of source audio 104 and ambient noise signals 102 to produce noise RMS estimates 126 for computing gain 132.

The system 200 has two inputs: microphone audio 102 that provides an audio signal representation of environmental sounds plus filtered source audio 104 in the audio environment for which the system is installed; and source audio 104 that provides an audio signal representation of the sounds to be broadcast from one or more loudspeakers in the audio environment for which the system 200 is installed.

Optional filter 106 filters the incoming microphone audio 102 and the source audio 104 and is preferably a perceptual weighting filter, such as an A-Weighting filter, applied here to help the system 200 to respond to noise in a manner more consistent with human perception. In another embodiment, filter 106 may be omitted. In yet another embodiment, a microphone portion of filter 106 may be integral with the microphone.

Computational section 208 computes the microphone RMS signal 242 and the source RMS signal 244 from the microphone audio signal 102 and the source audio signal 104 or, optionally, filtered microphone audio signal 138 and filtered source audio signal 140. In a preferred embodiment, the microphone portion of computational section 208 may be integral with the microphone. The input signals 138 and 140 to the computational section 208 are sampled at the high audio rate denoted frequency sampling audio (FS_AUDIO). In some preferred embodiments, FS_AUDIO is set to 48 kHz. Other embodiments may use other FS_AUDIO frequencies. The RMS computation is done by squaring the input signals 138 and 140, and then filtering each with an infinite impulse response (IIR) lowpass filter, and then taking the square root of the result. In some preferred embodiments, the time constant for the RMS computation is sixty milliseconds, but this is not a limitation of the present invention. In various other embodiments, other time constants may be used.

The audio-rate microphone RMS signal 242 and the audio-rate source RMS signal 244 are each then subjected to a down-sampling process in down-sampler 210 where the number of RMS samples per second are reduced from FS_AUDIO to a much slower RMS sampler frequency (FS_RMS). An FS_RMS of 20 Hz was found to work well in a preferred embodiment, but other rates may be chosen in various other embodiments. Ideally, down-sampler 210 would process the RMS data 242 and 244 with an anti-aliasing filter. However, a complex anti-aliasing filter offers little benefit over a simple summing averaging filter, which is preferred. In various other embodiments, a complex anti-aliasing filter may be used.

Squaring section 202 squares the down-sampled microphone RMS signal 246 and the down-sampled source RMS signal 248 before each is used by the adaptive filter 220. This is a critical component of the invention. When two uncorrelated audio signals are summed together, as with the microphone's signal 102 in our case containing source audio 104 and ambient noise, the RMS level of the sum relates to the signals in the following way:

$$RMS(Z) = \sqrt{RMS(X)^2 + RMS(Y)^2},$$

where $Z = X + Y$ and $X$ and $Y$ are uncorrelated

In our specific application, we have:

$$RMS(Mic) = \sqrt{RMS(Source)^2 + RMS(Noise)^2},$$

and thus $RMS(Mic)^2 = RMS(Source)^2 + RMS(Noice)^2$ and thus $RMS(Noise)^2 = RMS(Mic)^2 - RMS(Source)^2$ By operating on the RMS^2 data, linearly related signals are produced, which is a prerequisite of preferred adaptive filter 220.

Optional filter 214 filters the down-sampled RMS^2 microphone data 204 and the down-sampled RMS^2 source data 206 to produce adaptive filter 220 inputs of source RMS^2 data 216 and microphone RMS^2 data 218. Filter 214 may be omitted in some embodiments, but helps improve performance of the adaptive filter 220. In one embodiment, high-pass filtering the RMS data 216 and 218 helped improve the accuracy of the result. If done, filter 214 must be on the down-sampled RMS^2 microphone data 204 and the down-sampled RMS^2 source data 206, not the down-sampled microphone RMS data 246 and the down-sampled source RMS data 248, in order for assumptions of linearity to hold true.

Adaptive filter 220 takes the source and mic RMS^2 levels 216 and 218 as inputs and delivers a noise RMS^2 level 222 as its output. Note that the Noise RMS^2 level 222 is the natural output of such an adaptive filtration process, since NoiseRMS^2 = MicRMS^2 − SourceRMS^2 as mentioned above. Note that in actuality two independent signals will be momentarily correlated to varying degrees which will cause the equation given above to not hold true to varying degrees, but when the relationship is viewed over a long period of time, the two signals appear uncorrelated and the RMS relationships hold as expected.

This implies that there will be short-term errors in the results due to the short-term correlations of the source audio 104 and ambient noise 104. Thus, there is a need for some smoothing and long-term analysis of the result to get accurate estimates. The aggressiveness of the adaptive filter 220 can be modified in known ways in order to accomplish the required level of smoothing. For example, in a typical closed-loop adaptive filter 220, the adaptation coefficient alpha can be modified such that the filter 220 does not over-react to momentary errors induced by short-term correlations of the source 104 and ambient noise 102 signals.

Section 224 takes the square root of the Noise RMS^2 signal 222 to deliver the Noise RMS estimate signal 126.

Gain computer 130 uses known ANC algorithm logic which tracks the Noise RMS estimate levels 126 and computes a gain target 132 based on those levels. The specifics are not relevant to this patent, other than the fact that the gain computation is assumed to use ambient noise RMS levels as a factor in the gain computation. The gain target 132 is applied to the source audio 104 in amplifier 134 to produce gained source audio 136 to drive the loudspeakers.

While the microphone would typically transmit the RMS data 242 to a main processing unit, in some embodiments audio source RMS data 244 is transmitted to the microphone's processing unit and an estimate of the noise levels 126 on that processor (sending back target gains 132 to the main processor).

The following claims may contain some functional language and do not contain any statements of intended use.

We claim:

1. An adaptive filtering apparatus for ambient noise compensation system comprising:
   a. an audio output coupling operable to supply noise-compensated gained source audio from an adaptive filter to loudspeakers for transmission into an environment, wherein said environment comprises at least one audio zone;
   b. an audio source input coupling operable to receive a source audio signal into an adaptive filter for ambient noise compensation;
   c. a microphone input coupling operable to receive a microphone audio signal responsive to environmental audio within said environment, wherein said environmental audio includes ambient noise and at least a portion of said loudspeaker transmission as filtered by an audio response of said environment;
   d. at least one processor operable to estimate ambient noise levels in said environment and apply gains to said source audio based on said ambient noise levels; and
   e. a method of mean-square (MS) adaptive filtering for ambient noise compensation (ANC) systems instantiated in said at least one processor, operable to execute the steps of:
      i. determining an MS level of said source audio signal using an audio sampling rate;
      ii. determining an MS level of said microphone audio signal using said audio sampling rate, wherein said microphone audio signal comprises ambient sounds in an audio zone;
      iii. down sampling said MS level of said source audio signal, using a source MS level down-sampling rate, to obtain a down-sampled source audio MS level;
      iv. down sampling said MS level of said microphone audio signal, using a microphone MS level down-sampling rate, to obtain a down-sampled microphone audio MS level;
      v. supplying said down-sampled source audio MS level and said down-sampled microphone audio MS level to said adaptive filter operable to produce a noise MS estimate level;
      vi. taking the square root of said noise MS estimate level to produce a noise RMS estimate level;
      vii. computing said gain based at least on said noise RMS estimate level; and
      viii. applying said gain to said source signal to produce said noise compensated gained source audio.

2. The system of claim 1, comprising pre-filtering said source audio signal and said microphone audio signal using a perceptual weighting filter prior to said determining of said MS level of said source audio signal and said MS level of said microphone audio signal, respectively.

3. The system of claim 2, wherein said perceptual weighting filter comprises an A-weighting filter.

4. The system of claim 1, wherein said audio sampling rate comprises 48 kHz.

5. The system of claim 1, wherein said source and microphone MS level down-sampling rates each comprise 20 Hz.

6. The system of claim 1, comprising post-filtering said down-sampled source audio MS level and said down-sampled microphone audio MS level using a high-pass filter.

7. The system of claim 1, wherein said determining an MS level comprises:
 a. squaring one of:
  i. said source audio signal input and said microphone audio signal input; and
  ii. filtered said source audio signal input and filtered said microphone audio signal input; and
 b. filtering each said input with a digital infinite impulse response (IIR) lowpass filter.

8. The system of claim 1, wherein said down sampling comprises a use of an anti-aliasing filter.

9. The system of claim 1, comprising adjusting an adaptation coefficient alpha in said adaptive filter to reduce momentary errors induced by short-term correlations of said source and ambient noise signals.

10. The system of claim 1, wherein said at least one processor comprises a distributed processor.

11. The system of claim 1, wherein:
 a. said microphone audio signal is received by an input of an audio signal processor within a microphone operable to be coupled to said microphone coupling;
 b. said audio signal processor within said microphone is operable to produce a processed microphone signal; and
 c. said processed microphone signal is at least one of:
  i. MS values;
  ii. RMS values;
  iii. a noise RMS estimate; and
  iv. a gain value.

12. An adaptive filtering apparatus for ambient noise compensation system comprising:
 a. an audio output coupling operable to supply noise-compensated gained source audio from an adaptive filter to loudspeakers for transmission into an environment, wherein said environment comprises at least one audio zone;
 b. an audio source input coupling operable to receive a source audio signal into an adaptive filter for ambient noise compensation;
 c. a microphone input coupling operable to receive a microphone audio signal responsive to environmental audio within said environment, wherein said environmental audio includes ambient noise and at least a portion of said loudspeaker transmission as filtered by an audio response of said environment;
 d. at least one processor operable to estimate ambient noise levels in said environment and apply gains to said source audio based on said ambient noise levels; and
 e. a method of root-mean-square (RMS) adaptive filtering for ambient noise compensation (ANC) systems instantiated in said at least one processor, operable to execute the steps of:
  i. determining an RMS level of a source audio signal using an audio sampling rate;
  ii. determining an RMS level of a microphone audio signal using said audio sampling rate, wherein said microphone audio signal comprises said source audio and ambient sounds in an audio zone;
  iii. down sampling said RMS level of said source audio signal, using a source RMS level down-sampling rate, to obtain a down-sampled source audio RMS level;
  iv. down sampling said RMS level of said microphone audio signal, using a microphone RMS level down-sampling rate, to obtain a down-sampled microphone audio RMS level;
  v. squaring said down-sampled source audio RMS level to obtain source audio RMS^2 level;
  vi. squaring said down-sampled microphone audio RMS level to obtain microphone audio RMS^2 level;
  vii. supplying said source audio RMS^2 level and said microphone audio RMS^2 level to an adaptive filter to produce noise RMS^2 estimate level as a difference between said microphone audio RMS^2 level and said source audio RMS^2 level;
  viii. taking the square root of said noise RMS^2 estimate level to produce a noise RMS estimate level;
  ix. computing said gain based on said noise RMS estimate level; and
  x. apply said gain to said source signal to produce gained source audio.

13. The system of claim 12, comprising pre-filtering said source audio signal and said microphone audio signal using a perceptual weighting filter prior to said determining of said RMS level of said source audio signal and said RMS level of said microphone audio signal, respectively.

14. The system of claim 12 wherein:
 a. said audio sampling rate comprises 48 kHz; and
 b. said source and microphone RMS level down-sampling rates each comprise 20 Hz.

15. The system of claim 12, comprising post-filtering said down-sampled source audio RMS^2 level and said down-sampled microphone audio RMS^2 level by:
 a. at least one of:
  i. a high-pass filter; and
  ii. a digital filter;
 b. wherein said determining an RMS level comprises:
  i. squaring one of:
   (1 said source audio signal input and said microphone audio signal input; and
   (2 filtered said source audio signal input and filtered said microphone audio signal input;
  ii. filtering each said input with a digital infinite impulse response (IIR) lowpass filter; and
  iii. taking a square root of each filtered sample.

16. The system of claim 12, comprising adjusting an adaptation coefficient alpha in said adaptive filter to reduce momentary errors induced by short-term correlations of said source and ambient noise signals.

17. The system of claim 12, wherein said at least one processor comprises a distributed processor.

18. The system of claim 12, wherein:
 a. said microphone audio signal is received by an input of an audio signal processor within a microphone operable to be coupled to said microphone coupling;
 b. said audio signal processor within said microphone is operable to produce a processed microphone signal; and
 c. said processed microphone signal is at least one of:
  i. MS values;
  ii. RMS values;
  iii. a noise RMS estimate; and
  iv. a gain value.

19. An adaptive filtering apparatus for ambient noise compensation system comprising:

a. at least one processor operable to estimate ambient noise levels in said environment and apply gains to a source audio based on ambient noise level estimates; and
b. a method of mean-square (MS) adaptive filtering for ambient noise compensation (ANC) instantiated in said at least one processor, comprising:
  i. determining an MS level of said source audio signal using an audio sampling rate;
  ii. determining an MS level of said microphone audio signal using said audio sampling rate;
  iii. down sampling said MS level of said source audio signal to obtain a down-sampled source audio MS level;
  iv. down sampling said MS level of said microphone audio signal to obtain a down-sampled microphone audio MS level;
  v. supplying said source audio MS level and said microphone audio MS level to an adaptive filter operable to produce a noise MS estimate level;
  vi. taking the square root of said noise MS estimate level to produce a noise RMS estimate level;
  vii. computing gain based at least on said noise RMS estimate level.

20. An adaptive filtering apparatus for ambient noise compensation system comprising:
a. at least one processor operable to estimate ambient noise levels in an audio environment and apply gains to a source audio based on ambient noise level estimates; and
b. a method of root-mean-square (RMS) adaptive filtering for ambient noise compensation (ANC) systems instantiated in said processor, comprising:
  i. determining an RMS level of a source audio signal using an audio sampling rate;
  ii. determining an RMS level of a microphone audio signal using said audio sampling rate, wherein said microphone audio signal is composed of ambient sounds in an audio zone;
  iii. down sampling said RMS level of said source audio signal to obtain a down-sampled source audio RMS level;
  iv. down sampling said RMS level of said microphone audio signal to obtain a down-sampled microphone audio RMS level, wherein said down sampling comprises use of an anti-aliasing filter;
  v. squaring said down-sampled source audio RMS level to obtain source audio RMS^2 level;
  vi. squaring said down-sampled microphone audio RMS level to obtain microphone audio RMS^2 level;
  vii. supplying said source audio RMS^2 level and said microphone audio RMS^2 level to an adaptive filter to produce noise RMS^2 level as a difference between said microphone audio RMS^2 level and said source audio RMS^2 level;
  viii. taking the square root of said noise RMS^2 level to produce a noise RMS level;
  ix. compute gain based on said noise RMS level.

* * * * *